United States Patent [19]

Masur et al.

[11] Patent Number: 5,683,969
[45] Date of Patent: Nov. 4, 1997

[54] STRONGLY-LINKED OXIDE SUPERCONDUCTOR AND A METHOD OF ITS MANUFACTURE

[75] Inventors: Lawrence J. Masur, Needham; Eric R. Podtburg, Newton, both of Mass.

[73] Assignee: American Superconductor Corporation, Westborough, Mass.

[21] Appl. No.: 881,675

[22] Filed: May 12, 1992

[51] Int. Cl.$^6$ .................................................. H01L 39/24
[52] U.S. Cl. ........................ 505/431; 29/599; 505/433; 505/500; 505/736; 505/742; 505/740
[58] Field of Search ........................ 29/599; 505/430, 505/431, 433, 500, 736, 740, 742

[56] References Cited

U.S. PATENT DOCUMENTS

| | | |
|---|---|---|
| 5,034,373 | 7/1991 | Smith et al. . |
| 5,093,314 | 3/1992 | Takahashi et al. . |
| 5,204,316 | 4/1993 | Arendt et al. ..................... 29/599 X |
| 5,246,917 | 9/1993 | Hikata et al. ..................... 29/599 X |
| 5,424,282 | 6/1995 | Yamamoto et al. ................ 505/430 |

FOREIGN PATENT DOCUMENTS 234404  5/1991  New Zealand .

OTHER PUBLICATIONS

"Resolutions to difficulties experienced in SSC cable fabrication during the initial scale-up period" Hannaford et al. *IEEE Transactions on Magnetics.* 27(2):2024–2026 (Mar. 1991).

"Preparation of Y–Ba–Cu–O superconducting tape by pyrolysis of organic acid salts" Amemiya et al. *IEEE Transactions on Magnetics.* 27(2):905–908 (Mar. 1991).

"Pressure Effect on $T_c$ of Superconductor $YBa_2Cu_4O_8$" Yamada et al. *Jap. J. Appl. Phys.* 29(2)L250–253 (Feb. 1990).

"Calcium–substituted Y–Ba–Cu–O superconductors with enhanced $T_c$ synthesized at elevated oxygen pressures" Morris et al. *Phys. Rev. B.* 41(7):4118–4122 (Mar. 1990).

"High–pressure studies on the 90K superconductors $Y_2Ba_4Cu_7O_{15}$ and $(Y/Ca)Ba_2Cu_4O_8$" Tallon et al. *Physica C.* 167(1&2):236–242 (Apr. 15, 1990).

"A new domain structure in $YBa_2Cu_3O_{7-x}$ prepared by the quench and melt growth (QMG) process" Kimura et al. *Physica C.* 174(4–6):263–272 (Mar. 15, 1990).

(List continued on next page.)

Primary Examiner—Joseph M. Gorski
Attorney, Agent, or Firm—Choate Hall & Stewart

[57] ABSTRACT

A strongly-linked polycrystalline oxide superconductor article includes an oxide superconductor selected from the group consisting 124-type and 247-type oxide superconductors having fine, highly aligned oxide superconductor grains less than 50 μm along a longest dimension. The oxide superconductor article has at least a 25% retention of critical current density in a 0.1 Tesla field. A method for preparing a strongly-linked oxide superconductor includes shaping a finely divided metallic precursor of an oxide superconductor; oxidizing the finely divided metallic precursor to produce a finely divided sub-oxide species while avoiding conversion of an appreciable amount of the sub-oxide species into the oxide superconductor; annealing and deforming the article, in either order, the annealing carried out at a temperature and for a time sufficient to convert some of the sub-oxide species into fine grains of the oxide superconductor thereby forming a mixture of sub-oxide species and oxide superconductor and the deformation carried out such that the fine grains of oxide superconductor are rotated into alignment parallel to an intended current carrying direction of the article without fracturing or pulverization of the oxide superconductor grains; alternating annealing and deformation of the article until no further improvement in alignment is observed; and subjecting the aligned grains to a final anneal in order to react any remaining sub-oxide species and maximize the growth and sintering of existing aligned grains.

16 Claims, 5 Drawing Sheets

OTHER PUBLICATIONS

T. Miyatake, et al. "Critical Current Densities and Microstructure of $YBa_2Cu_4O_8$" from the Proceedings of ISS '90, Sendai, Japan, Nov., 1990; Advances in Superconductivity III: Springer–Verlag, Tokyo, Japan 1991).

T. Miyatake, et al. "Critical Current Densities of $Y_{1-x}Ca_xBa_2Cu_4O_8$ (x=0 and 0.1) Superconducting Ceramics" *Jap. J. Appl. Phys.* 29(7), L1079–L1082 (Jul., 1990).

T. Miyatake, et al. "90K Superconductivity in Ca–Substituted $YBa_2Cu_4O_8$".

R. B. Poeppel, et al. "Fabrication and Wire Extrusion of Ceramic Superconductors" *Proceedings of the Second Topical Conference on Emerging Technologies in Materials*, San Franciso, CA (Nov. 6–9, 1989) with a May, 1991 date on the title page.

J. Horn, et al. "On the Preparation of $Y_1Ba_2Cu_4O_8$" *Solid State Comm.* 79(6), 483–486 (1991).

R. K. Williams, et al. "Preparation and grain boundary chemistry of dense polycrystalline $YBa_2Cu_4O_{-8}$" *J. Appl. Phys.* 69(4), 2426–2430 (Feb. 15, 1991).

S. Hayashi, et al. "Properties of Ag–Sheathed Bi–2223, Bi–2212 and Y–124 Superconducting Wires" ICMC '90 Topical Conference with a received stamp date of Oct. 16, 1990.

A. Otto, et al. "Superconducting Properties and Formation of $Yb_2Ba_4Cu_7O_{14-x}$" *Physica C* 160, 352–360 (1989).

T. Kogure, et al. "Formation of $Yb_nBa_{2n}Cu_{3n+1}O_x$ (n=3,4) by oxidation of Yb–Ba–Cu–Ag Metallic Precursors" *Physica C* 157, 159–163 (1989).

Excerpt from *Superconductor Week* regarding "CryoPower Associates", p. 7, Dec. 16, 1991.

S. Chadda, et al. "Synthesis of $YBa_2Cu_3O_{7-y}$ and $YBa_2Cu_4O_8$ by Aerosol Decomposition" *J. Aerosol Sci.* 22(5), 601–616 (1991) with a received stamp date of May 6, 1991.

K. H. Sandhage, et al. "Critical Issues in the OPIT Processing of High–$J_c$ BSCCO Superconductors" *J. Min. Met. Matl.* 43(3), 21–25 (Mar., 1991).

J. W. Ekin et al. "Transport critical current of aligned polycrystalline $Y_1Ba_2Cu_3O_{7-\delta}$ and evidence for a non-eweak–linked component of intergranular current conduction" *J. Appl. Phys.* 68(5), 2285–2295 (Sep. 1, 1990).

K. Shibutani, et al. "$J_c$–B Characteristics of Silver Sheathed Superconductors" *IEEE Trans. Mag.* 27, 897–900 (1991).

T. Kogure, et al. "Microstructure of $Yb_2Ba_4Cu_7O_x$/Ag Composites Produced by Oxidizing Metallic Precursors" *Physica C* 157, 351–357 (1989).

T. Kogure, et al. "Superconducting $Yb_2Ba_4Cu_7O_x$ Produced by Oxidizing Metallic Precursors" *Physica C* 156 45–56 (1988).

```
——————————— CuO₂ PLANE
– – – – – – – Y
——————————— CuO₂ PLANE
—·——·——·——  BaO
━━━━━━━━━━━  CuO CHAIN
━━━━━━━━━━━  CuO CHAIN
—·——·——·——  BaO
124-TYPE
```

FIG. 1A

```
——————————— CuO₂ PLANE
– – – – – – – Y
——————————— CuO₂ PLANE
—·——·——·——  BaO
━━━━━━━━━━━  CuO CHAIN
—·——·——·——  BaO
123-TYPE
```

FIG. 1B

```
——————————— CuO₂ PLANE
– – – – – – – Y
——————————— CuO₂ PLANE
—·——·——·——  BaO
━━━━━━━━━━━  CuO CHAIN
━━━━━━━━━━━  CuO CHAIN
—·——·——·——  BaO
——————————— CuO₂ PLANE
– – – – – – – Y
——————————— CuO₂ PLANE
—·——·——·——  BaO
━━━━━━━━━━━  CuO CHAIN
—·——·——·——  BaO
247-TYPE
```

STRONGLY-LINKED OXIDE SUPERCONDUCTOR AND A METHOD OF ITS MANUFACTURE

FIELD OF THE INVENTION

This invention relates to strongly-linked polycrystalline oxide superconductor and oxide superconductor composites. This invention further relates to a method for producing strongly-linked polycrystalline oxide superconductor articles.

BACKGROUND OF THE INVENTION

Polycrystalline, randomly oriented oxide superconductors exhibit critical current densities orders of magnitude lower than that of single crystal or highly oriented materials. The decrease in critical current density, as measured across grain boundaries in a randomly oriented material, is attributed to grain boundary impurities or grain boundary mismatch. The decrease in critical current density ($J_c$) as measured across grain boundaries and, in particular, in the presence of a magnetic field is known as weakly-linked behavior.

Grain alignment or crystallographic texture has been shown to mitigate weakly-linked behavior of certain oxide superconductors and to permit "strongly-linked" behavior, allowing high current densities even in strong magnetic fields. Techniques used to produce grain alignment in oxide superconductors include melt texturing, magnetic alignment and mechanical deformation. Both melt texturing and magnetic alignment suffer from extremely slow processing speeds and the inability to process large amounts of material.

Melt texturing has been used to process oxide superconductors, in particular, the yttrium barium cuprate (YBCO) and bismuth strontium calcium cuprate (BSCCO) systems. Melt textured oxide superconductors have good grain alignment, high critical current density and strongly-linked grains. These qualities are obtained by forming large (millimeter scale) well-aligned grains. While such large grains are highly desirable for current transport, melt textured materials are brittle and can not be easily formed into complex shapes. A fine grained material (micron scale) would have the greater flexibility required for bulk applications such as current-carrying wires.

Mechanical deformation is widely used in the metal and ceramic arts to induce alignment by a purely mechanical means, for example, the alignment of fibers in a fiber-reinforced metal. In ceramic and ceramic composite materials, deformation processing is used to rotate, and thereby align, grains and particles having high aspect ratios. Grain rotation by mechanical means in brittle materials, such as oxide superconductors, is challenging because of the tendency for the oxide superconducting grains to fracture and pulverize upon deformation.

It is generally felt in the art that $RE_1Ba_2Cu_4O_8$ (124) type oxide superconductors have inherently poor grain boundaries and are weakly-linked, where RE designates rare earth elements. By analogy, the $RE_2Ba_4Cu_7O_x$ (247) type oxide superconductors which are structurally related to the 124-type compound might be also considered weakly-linked. For example, Shibutani et al investigated the critical current characteristics of wires prepared from $[Y(Ca)]_1Ba_2Cu_4O_8$ by mechanical deformation and reported the wires to have poor critical current retention (<20% at approx. 0.1T). Shibutani et al. characterized the material as having incomplete grain boundary coupling and as being weakly-linked.

It is therefore an object of the present invention to provide $RE_1Ba_2Cu_4O_8$ type and $RE_2Ba_4Cu_7O_x$ type oxide superconductor material that is strongly-linked and that can significantly retain its critical current density in a magnetic field.

It is a further object of the present invention to provide $RE_1Ba_2Cu_4O_8$ type and $RE_2Ba_4Cu_7O_x$ type oxide superconductor material having well aligned oxide superconductor grains.

It is yet a further object of the present invention to provide a method for producing strongly-linked oxide superconductor material on a large scale.

SUMMARY OF THE INVENTION

In one aspect of the invention, a strongly-linked oxide superconductor article includes fine, highly aligned oxide superconductor grains having at least a 25% critical current density retention in a field of 0.1 Tesla at 4.2K as measured in a four point probe over a distance of at least 1 cm. The oxide superconductor is selected from the group consisting of 124-type and 247-type oxide superconductors. In preferred embodiments, the grains are less than 1000 μm along a longest dimension, more preferably less than 500 μm and most preferably less than 100 μm along a longest dimension.

By "critical current density retention", as that term is used herein, it is meant the amount of critical current density retained at a given magnetic field strength as compared to the critical current density measured at zero Tesla (no magnetic field) at 4.2K. The value is reported as a percent.

Figure 1A:
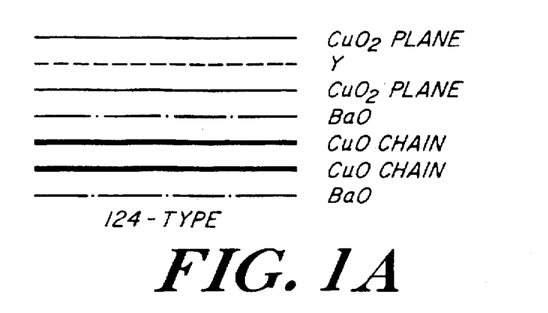
FIG. 1 is a schematic illustration of the crystal structure of (a) 124-type oxide superconductors, (b) 123-type oxide superconductors and (c) 247-type oxide superconductors.
Figure 1B:
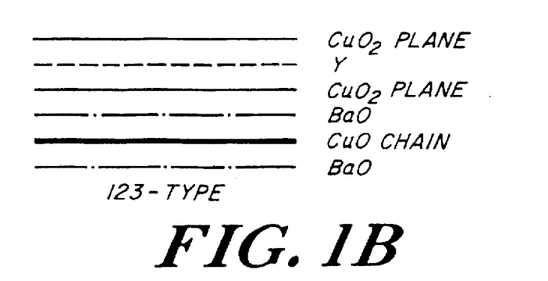
Figure 1C:
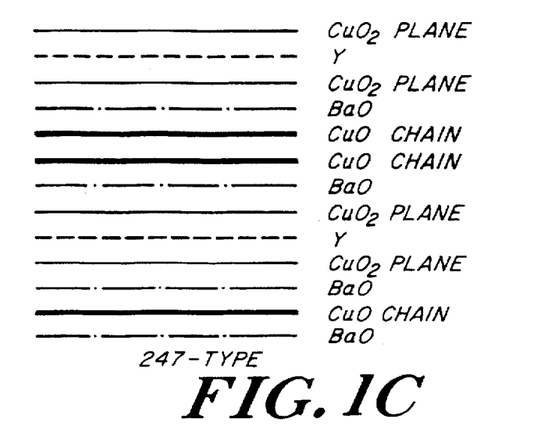

By "124-type" oxide superconductor, as that term is used herein, it is meant an oxide superconductor in which the ratio of the component yttrium or rare earth element, barium and copper, is substantially 1:2:4. The 124-type oxide superconductor is further characterized as having the following arrangement of lattice planes shown schematically in FIG. 1a: $CuO_2$ plane/Y/$CuO_2$ plane/BaO/CuO chains/CuO chains/BaO. Likewise, by "123-type" and "247-type" oxide superconductor, as those terms are used herein, it is meant an oxide superconductor in which the ratio of component yttrium or rare earth element, barium and copper is substantially 1:2:3 and 2:4:7, respectively. The 123-type oxide superconductor is further characterized as having the following arrangement of lattice planes shown schematically in FIG. 1b: $CuO_2$ plane/Y/$CuO_2$ plane/BaO/CuO chains/BaO. The 247-type oxide superconductor is further characterized as having the following arrangement of lattice planes shown schematically in FIG. 1c: $CuO_2$ plane/Y/$CuO_2$ plane/BaO/CuO chains/CuO chains/BaO/$CuO_2$ plane/Y/$CuO_2$ plane/BaO/CuO chains/BaO. Further, the constituent metallic elements can be substituted by non-rare earth elements so long as the overall composition maintains the relative 1:2:4, 1:2:3 or 2:4:7 ratio.

By "highly aligned oxide superconductor grains", it is meant that grains are oriented such that the a-b planes are locally aligned parallel to the direction of current flow.

By "strongly-linked" behavior, as that term is used herein, it is meant that the tested oxide superconductor retains at least 25% of the critical current density at 0.1 Tesla as compared to the current density at 0 field at 42K. Testing of critical current density is done using a four point probe technique over a distance of 1 cm.

In preferred embodiments, the oxide superconductor is $YBa_2Cu_4O_8$ or $[Y(Ca)]_1Ba_2Cu_4O_8$. The polycrystalline oxide superconductor article may further include a noble metal selected from the group consisting of silver, gold and their alloys. The noble metal may be intimately mixed with or contactingly surround the oxide superconductor. The strongly-linked polycrystalline oxide superconductor article may be in the form of a wire, ribbon or sheet.

By "noble metal", as that term is used herein, it is meant a metal that is chemically inert with respect to reaction with the oxide superconductor and with oxygen.

In another aspect of the invention, a strongly-linked polycrystalline oxide superconductor composite article includes at least one oxide superconductor filament contained within a noble metal. The oxide superconductor is selected from the group consisting of 124-type and 247-type oxide superconductors. The oxide superconductor possesses fine, highly aligned oxide superconductor grains having at least a 25% retention of critical current density in a 0.1 Tesla field. In preferred embodiments, the grains are less than 1000 µm along a longest dimension, more preferably less than 500 µm and most preferably less than 100 µm along a longest dimension.

In preferred embodiments, the oxide superconductor of the composite article is $YBa_2Cu_4O_8$ or $[Y(Ca)]_1Ba_2Cu_4O_8$. The noble metal is selected from the group consisting of silver, gold and its alloys. The noble metal contactingly surrounds the oxide superconductor filament and may be intimately mixed with the oxide superconductor.

In other preferred embodiments, the oxide superconductor composite article contains a plurality of oxide superconductor filaments. In a more preferred embodiment, the composite article has between 100 and 200,000 filaments and each filament has a lateral cross-sectional area of less than 25 $\mu m^2$. The strongly-linked polycrystalline oxide superconductor composite article may be in the form of a wire, ribbon or tape or sheet.

In another aspect of the present invention, a strongly-linked polycrystalline oxide superconductor article is prepared by (a) producing a finely divided metallic precursor of the oxide superconductor in a desired shape, (b) oxidizing the finely divided metallic precursor at a temperature sufficient to produce a finely divided sub-oxide species and insufficient to convert an appreciable amount of the sub-oxide species into the desired oxide superconductor, (c) annealing and deforming the article, in either order, the annealing carried out at a temperature and for a time sufficient to convert some of the sub-oxide species of the article into fine grains of the desired oxide superconductor such that a mixture of sub-oxide species and oxide superconductor is formed and the deformation carried out such that the fine grains of oxide superconductor are rotated into alignment so that the grains are parallel to an intended current carrying direction of the article without substantial fracture or pulverization of the oxide superconductor grains, (d) alternating annealing and deformation of the article until no further improvement in alignment is observed and (e) subjecting the aligned grains to a final anneal in order to react any remaining sub-oxide species and maximize the growth and sintering of existing aligned grains. In preferred embodiments, step (d) is performed two to ten times.

By "sub-oxide species", as that term is used herein, it is meant simple, binary and ternary oxides of the component metals of the oxide superconductor. The temperature of step (b) should be insufficient to convert an appreciable amount of the metallic precursor into the oxide superconductor. In preferred embodiments, the temperature is in the range of 300°–500° C. The annealing temperature used in step (c) should be sufficient to convert some, but not all, of the sub-oxide species created in step (b) into the oxide superconductor. The temperature is preferably in a range of 550°–960° C. The anneal time in step (c) is adjusted to allow only partial conversion of the sub-oxide species to the oxide superconductor and is preferably less than one hour and more preferably 0.1 hour.

The method can be used for any shape, such as wires, ribbons or sheets. The finely divided metallic precursor can include additional materials such as a noble metal. The finely divided metallic precursor can be obtained by conventional methods. A preferred method is mechanical alloying of the constituent metals.

A wire is formed by introducing finely divided metallic precursor into a noble metal sheath and extruding. In a preferred embodiment, the wire is multi filamentary and is formed by grouping together a number of extruded wires and further co-extruding the grouped extruded wires. A tape or ribbon is formed by introducing the finely divided metallic precursor into a noble metal sheath and rolling the powder-filled sheath. In another preferred embodiment, the tape is a laminar tape and is formed by stacking together a number of rolled tapes and subjecting the stacked tapes to the deformation and annealing processes of step (c). A sheet can be formed by introducing finely divided metallic precursor into a noble metal can and upset forging.

The disclosed method for preparing a strongly-linked oxide superconductor article can be used for any oxide superconductor having grains with high aspect ratios. In particular, it can be used with oxide superconductors of the 123-type, 124-type and 247-type.

Deformation can be accomplished using known techniques, such as pressing, rolling, wire drawing, extruding, swaging or applying a Turk's head. Strains sufficient to effect a 50–95% reduction in thickness of the article are applied.

A particular example of the present invention is a strongly-linked 124-type oxide superconductor wire which is prepared by (a) introducing a finely divided metallic precursor of a 124-type oxide superconductor into a silver sheath, (b) extruding the sheathed metallic precursor into a wire, (c) oxidizing the wire at a temperature in the range of 300°–500° C., (d) annealing and deforming the wire, in either order, the annealing carried out at a temperature in the range of 550°–800° C. and for a time surf dent to convert some of the sub-oxide species of the article into fine grains of 124-type oxide superconductor so that a mixture of sub-oxide species and 124-type oxide superconductor is formed and the deformation carried out such that the fine grains of oxide superconductor are rotated into alignment parallel to an intended current carrying direction of the wire without substantial fracture or pulverization of the oxide superconductor grains, (e) alternating annealing and deformation of the wire until no further improvement in alignment is observed and (f) subjecting the aligned grains to a final anneal in order to react any remaining sub-oxide species and maximize the growth and sintering of existing aligned grains.

Oxide superconductor articles prepared according to the method of the invention possess superior properties with respect to critical current density and retention of the critical current density in a magnetic field as compared to oxide superconductor materials prepared by conventional methods.

DESCRIPTION OF THE PREFERRED EMBODIMENT

Mechanical deformation has been used previously to improve texture in the BSCCO system as described by Sandhage et al. (*J. Min. Met. Mater. Soc.* 43(3), 21–25(1991) ). The known process involves introducing oxide superconducting powders into a metal tube and performing repeated deformation and anneal steps. This process has worked well for the BSCCO system and has resulted in high retention of critical current density in an applied magnetic field. However, similar results have not been observed for 123-type oxide superconductors because of the lower aspect ratio, reduced porosity and weaker mechanical properties of these powders.

During deformation of oxide superconductor powders, the plate-like grains fracture and pulverize easily if their ability to rotate is impeded. Furthermore, significant grain growth and sintering does not occur after fracture and pulverization even after hundreds of hours of heat treatment. This is especially true in the YBCO system. Therefore, the process successfully employed for the BSCCO system can not be used in the YBCO system.

The applicants have discovered that a novel thermomechanical process using the metallic precursors of the desired oxide superconductor and involving alternating annealing and deformation steps provides an oxide superconductor having highly aligned grains and exhibiting improved retention of critical current in an applied magnetic field. These oxide superconductor materials exhibit strongly-linked behavior.

Polycrystalline oxide superconductors of the present invention have preferably at least a 25% retention of $J_c$ in a 0.1 Tesla field. More preferably, the oxide superconductors have a $J_c$ retention of at least 30% in a 0.1 Tesla field. The invention has produced oxide superconductors with retention of 34% in a 0.1 Tesla field. The oxide superconductor may be a 247-type or, preferably, a 124-type oxide superconductor of yttrium or a rare earth, barium and copper. The rare earth can be any of the rare earth elements of the periodic table and, in particular, may be Nd, Sm, Eu, Gd, Dy, Ho, Er, Tm, Yb, Lu, La and Pro. A preferred 124-type oxide superconductor is $YBa_2Cu_4O_8$. The oxide superconductor is more preferably a substituted or doped version of a 124-type oxide superconductor. The dopant may be a non-rare earth element and can be substituted for any of the constituent rare earth, barium or copper of the oxide superconductor. The sum of the substituted and substituting elements make up the stated ratio of rare earth, barium and copper. A preferred 124-type oxide superconductor produced by partial substitution of yttrium by calcium is $[Y(Ca)]Ba_2Cu_4O_8$ and, more preferably, $Y_{0.9}Ca_{0.1}Ba_2Cu_4O_8$.

The oxide superconductor can be formed into a variety of functional shapes, such as a wire, ribbon, tape or sheet. Wires can have varying cross-sectional geometries, such as hexagonal, rectangular, square and circular geometries. Tapes or ribbons can be prepared with varying thicknesses and widths.

Best results have been achieved for multifilament oxide superconductor in a noble metal matrix. Silver, gold and their alloys are the preferred noble metal. Multi filaments of oxide superconductor phase preferably each have a lateral cross-sectional area of less than 25 $\mu m^2$. As the number of filaments increases, the cross-sectional area decreases accordingly. The small cross-section of the filaments provides for more uniform deformation and improved oxygen diffusion rates. Superconductors produced by the method of the invention contained about 100 to 200,000 filaments per article and had a $T_c$ of about 82° K.

In the present invention, the source of free energy to drive the grain growth and sintering process is the thermodynamic driving force of the reaction between component sub-oxides species to form the oxide superconductor. Strongly-linked oxide superconductors have been prepared by controlling grain growth arising from the energy released during transformation of primary oxides into an oxide superconductor.

Figure 2:
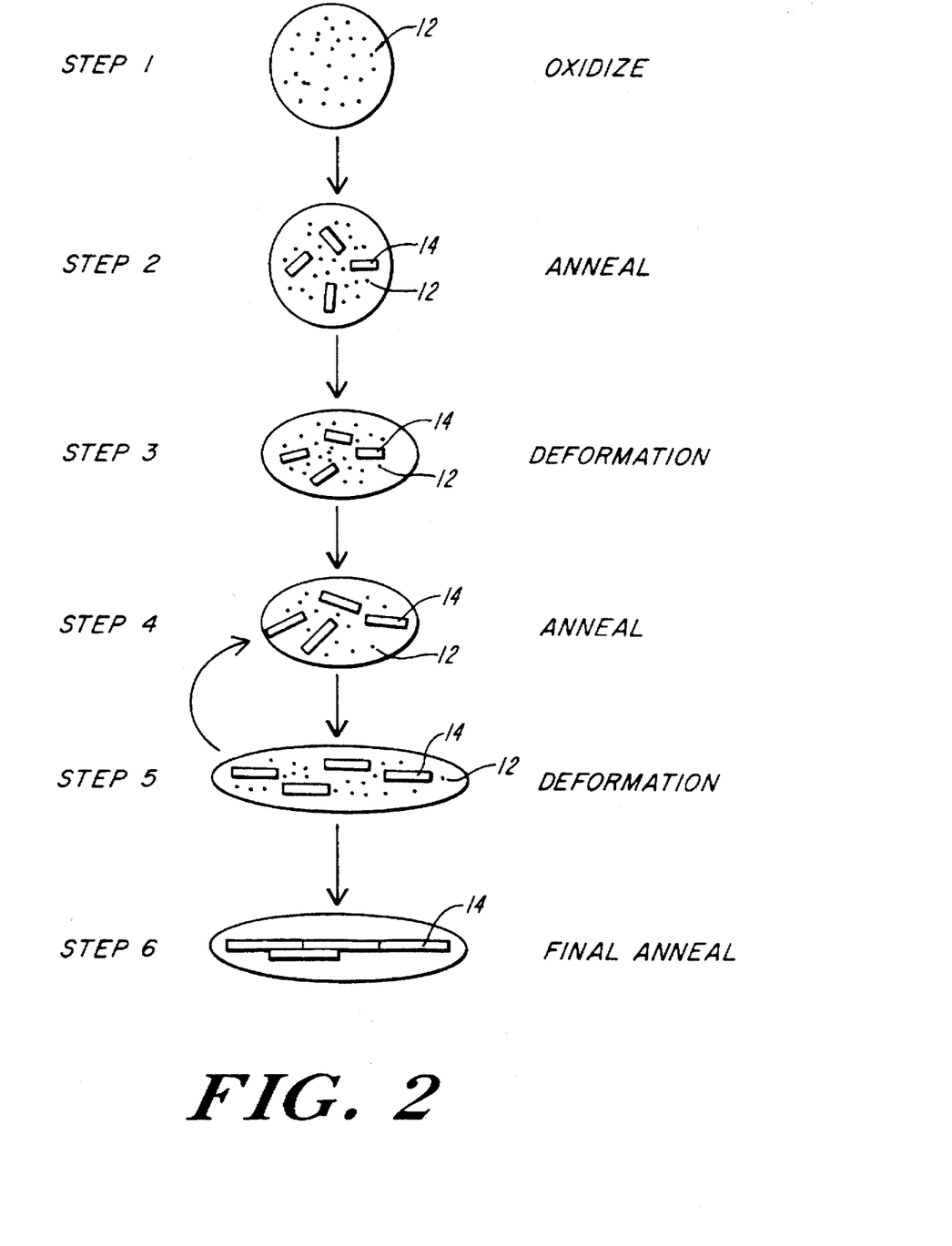
FIG. 2 is a schematic illustration of the method of the invention.

Referring to FIG. 2, the metallic precursor is oxidized in step 1 at a temperature selected to permit formation of sub-oxide species 12, while preventing the formation of appreciable amounts of oxide superconductor. Formation of up to 10 vol % oxide superconductor can be tolerated in this step. Sub-oxides species 12 are preferably finely divided and homogeneously distributed. A unique benefit of material made by the oxidation of metallic precursors is the finely divided, homogeneously distributed sub-oxide microstructure.

Upon anneal in step 2, the finely divided sub-oxide species 12 reacts to form grains 14 of an oxide superconductor. Note that the sub-oxide species 12 is not completely converted into the oxide superconductor. Typically, 5–30 vol % of total oxide species is converted in each anneal step. Anneal time is adjusted to prevent excessive conversion of the sub-oxide species to oxide superconductor and to prevent the growth of large grains. The fine sub-oxide grains resulting from the oxidation of the metallic precursor enables very fine oxide superconducting grains to form.

In step 3, the sub-oxide species/oxide superconductor mixture is subjected to deformation. The grains 14, because of their small size, resist fracturing and pulverization and can be easily rotated into alignment parallel to the current carrying direction. The deformation can be accomplished using any known operation including, but not limited to, rod rolling, strip rolling, wire flattening, drawing or extruding through a round or shaped orifice, swaging using a rotating die or cage and applying a Turk's head. The process of thermal treatment and deformation is iterated many times, as shown in steps 4 and 5, resulting in alignment of the oxide superconductor grains.

Steps 2 and 3 can be performed in either the order presented here or in reverse order. In some instances, a small amount of oxide superconductor is formed upon oxidation of the metallic precursor to the sub-oxide species and deformation can be carried out directly on the oxidized material without a prior anneal. In other cases, it may be advantageous to deform the sub-oxide species prior to anneal.

Both the thermal process of step 2 and the deformation process of step 3 are important. During each thermal treatment sub-oxide species 12 is reacted to form an oxide superconductor. It is desirable that some oxide remain after each thermal step so that subsequent reactions can be performed. During each deformation treatment, the small plate-like grains which have formed are caused to align by virtue of the strain induced in the material. Grain size should not be allowed to grow too large or the grains will resist rotation. It is crucial to apply sufficient strain to cause grain rotation but not so much that fracturing occurs. Sufficient strain effects a 50–95% thickness reduction of the treated article per deformation step.

The annealing and deformation steps of 2 and 3 are carried out until no further improvement in grain alignment is observed. Degree of alignment is determined using standard techniques, such as X-ray diffraction (pole figures) scanning and transmission electron microscopy (SEM and TEM) and is inferred by $J_c$ measurements in the presence of an applied magnetic field.

A final high temperature anneal (step 6) reacts all the remaining sub-oxide species and maximizes the growth and sintering of all existing grains. The result is a material that has significant retention of critical current density in an applied magnetic field.

The success of the above process, which we have termed "staged growth", is dependent upon the aspect ratio of the developing grains. It is clear that the higher the aspect ratio of the grains, the more efficient the rotation under deformation. For this reason, the higher aspect ratio grains of 124-type oxide superconductors are particularly well-suited for this type of processing. According to Kogure et al. (*Physica C* 157, 351–357 (1989)), 247-type oxide superconductors possess high aspect ratio grains similar to those of 124-type oxide superconductors and are expected to have similar electrical properties as 124-type oxide superconductors. It will, therefore, be apparent to those of the art that high aspect ratio grains of 247-type oxide superconductors could also be successfully processed according to the method of this invention. In the case of 123-type oxide superconductors, sub-oxide species react rapidly to completely form the oxide superconductor at the temperatures of interest. However, careful control of the anneal conditions should allow controlled formation of oxide superconductor grains in the sub-oxide species matrix, thereby allowing the above method to be applied to this class of oxide superconductors as well. Indeed, it should be apparent to those skilled in the art that any oxide superconductor with grains having an acceptably high aspect ratio could be processed according to the method of the present invention.

The advantages of the material and method of the present invention will become apparent from the description of the following examples.

The finely divided metallic precursors used in this invention were prepared by mechanical alloying in a Spex mill as described in U.S. Pat. No. 5,034,373. A Y-Ba-Cu-Ag or Y(Ca)-Ba-Cu-Ag alloy having the appropriate stoichiometry of the metallic constituents to form a 124-type oxide superconductor was packed into a silver tube under inert conditions. Silver powder typically comprises 10–50 wt % of the total powder. The silver tube can vary in dimension depending upon the desired size of the final wire. Dimensions of 1.57 cm o.d., 1.25 i.d. and 14 cm length were typical. The packed silver tube was then welded shut under a protective atmosphere. The silver tube was extruded to a wire using warm hydrostatic extrusion at 325° C. Multifilamentary wires were prepared by extruding hexagonally-shaped wires, cutting the extruded wire into shorter lengths, restacking into a billet in a hexagonal close-packed manner and co-extruding. The resulting multifilament wires can then themselves be stacked and further co-extruded to obtain wires containing the desired number of oxide superconductor filaments. Multifilament wires used in the present Examples typically had 130–18,000 oxide superconductor filaments per wire. However, wires containing up to 200,000 oxide superconductor filaments have been prepared. Wires typically have an overall dimension of about 0.090 to 0.240 cm. Tapes typically have overall dimensions of about 0.025 cm×0.25 cm to 0.050 cm×0.50 cm.

All critical current ($I_c$) and critical current density ($J_c$) measurements reported in the Examples were measured intergranularly with the four point test at 4.2K over a distance of 1 cm unless specifically noted otherwise. Critical current density was calculated using the cross-section of the oxide superconductor filaments.

EXAMPLE 1

This example establishes the weakly-linked behavior of an oxide superconductor wire prepared without the staged growth processing of the present invention.

A 133-filament wire with a diameter of 0.160 cm prepared as described above was oxidized in pure oxygen at 500° C. for 400 h, then annealed at 850° C. for 175 h to convert to the oxide superconductor. The presence of $YBa_2Cu_4O_8$

TABLE 1

| $J_c$ data for Example 1 samples. | | | |
|---|---|---|---|
| Sample No. | $I_c$ (A) | $J_c$ (A/cm$^2$) | $J_c$ (A/cm$^2$ at 0.1 Tesla) |
| 1 | 35 | 9030 | 1030 |
| 2 | 21 | 5420 | 620 |
| 3 | 20 | 5160 | 590 | was confirmed by X-ray diffraction analysis, electron microprobe and transmission electron microscopy. $J_c$ values for Example 1 are reported in Table 1. $J_c$ retention for these samples was about 10% in a 0.1 Tesla field.

EXAMPLE 2

Example 2 establishes the effect of multiple deformation and anneal operations on a fully oxidized oxide superconductor on the critical current and critical current retention.

Figure 3:
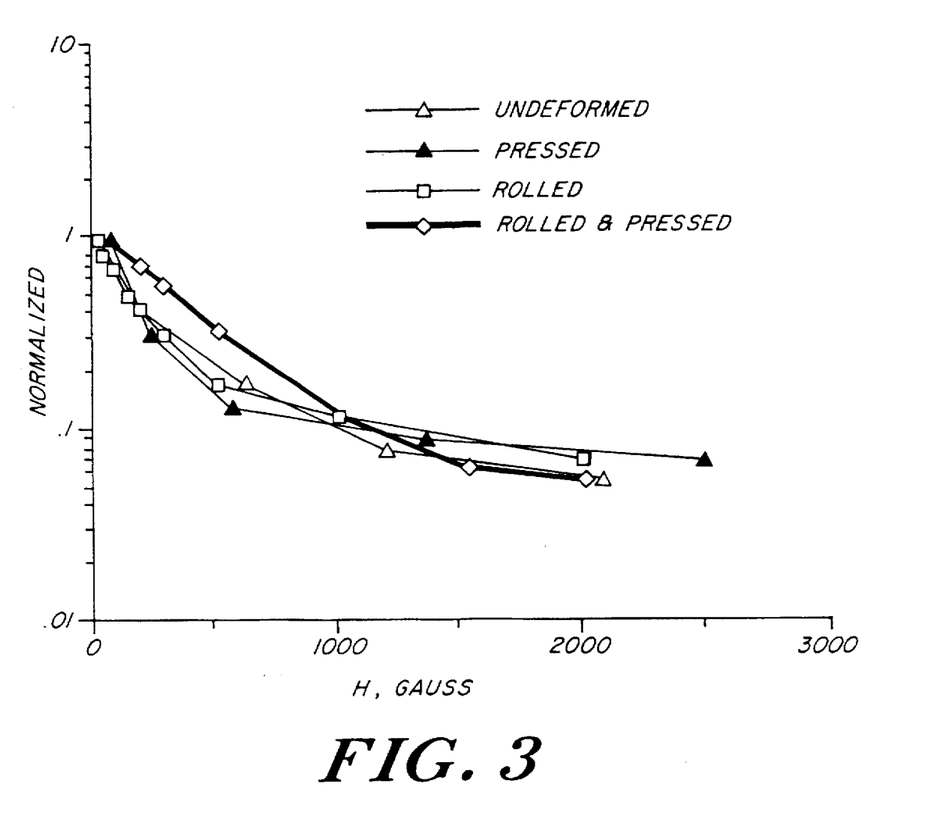
FIG. 3 is a plot of normalized critical current v. magnetic field illustrating the effect of a simple mechanical process on critical current for a $YBa_2Cu_4O_8$ oxide superconductor.

Oxidized samples fabricated according to Example 1 were deformed by rolling, uniaxial pressing and extrusion at room temperature in an attempt to align the oxide superconductor grains. Of the three deformation processes used, rolling processing at room temperature best improved the critical current density. Rolling processing consisted Of rolling a 0.160 cm diameter wire into a 0.0203 cm thick tape. The tape was then first annealed for 100 hours at 835° C. and then 825° C. for an additional 175 hours in pure oxygen. The tape was further rolled to 0.0127 cm and annealed for an addition 100 hours at 825° C. Even after hundreds of hours of post-annealing, the oxide superconductor grains appeared pulverized. FIG. 3 is a plot of normalized critical current v. magnetic field illustrating the effect of a simple mechanical process on critical current for a $YBa_2Cu_4O_8$ oxide superconductor. Note that no appreciable improvement in field performance has occurred. $J_c$ retention was about 10% in a 0.1 T magnetic field and sample still appears to be weakly-linked.

EXAMPLE 3

X-ray diffraction and electron microprobe analysis of samples annealed at 825° C. indicated that a multiphase mixture of $YBa_2Cu_4O$, and $YBa_2Cu_4O_8$ was present. Experiments run with anneal temperatures ranging from 790° C. to 860° C. in 10° increments clearly indicated that temperatures below 810° C. and, preferably below 800° C., were needed to obtain phase-pure $YBa_2Cu_4O_8$. Most of the data in the literature indicates that processing at temperatures below 860° C. under oxygen at ambient pressure would yield phase-pure $YBa_2Cu_4O_8$. Clearly, a unique processing pathway is provided by the metallic precursor approach.

Figure 4:
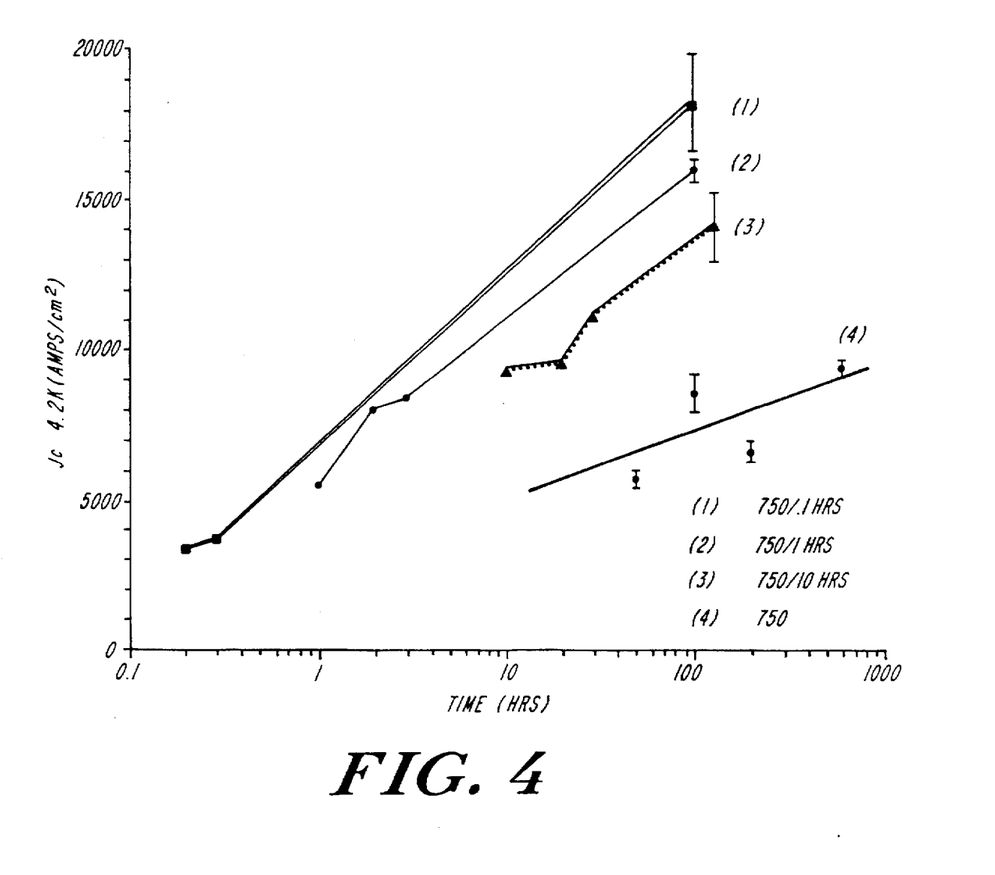
FIG. 4 is a plot of critical current density v. anneal time illustrating the effect of anneal time on critical current density obtained upon final annealing for a $YBa_2Cu_4O_8$ oxide superconductor.

Experiments in which anneal times were varied from 0.1 h to 10 h at a temperature of 750° C. indicated improved grain alignment with shorter anneal times. FIG. 4 is a plot of critical current density v. anneal time illustrating the improved critical current density with reduced anneal times obtained upon final annealing for a $YBa_2Cu_4O_8$ oxide superconductor. Presumably, the shortened anneal time swords smaller grains. This supports the proposition that small grains result in improved grain alignment.

With data indicating a trend towards lower processing temperatures and shorter processing times, it became obvious that the kinetics of the reaction to form $YBa_2Cu_4O_8$ from the metallic precursor material were much more rapid than previously thought. The enhanced kinetics appear to be due to the fine, submicron microstructure generated by oxidation of the metallic precursor. Based on these preliminary findings, the processing parameters determined to be important to staged growth processing, that is, reduced processing temperatures, increased pressing stress and increased thermomechanical iterations were adjusted to give the highest critical current retention of the series.

A material of stoichiometry $Y_{0.9}Ca_{0.1}Ba_2O_8$ was blended with 40 wt % Ag and mechanically alloyed in a Spex mill. The powder was placed into a copper-lined silver tube such that the overall stoichiometry was $Y_{0.9}Ca_{0.1}Ba_2Cu_4$/30 wt % Ag. The filled silver billet was extruded to a tape of 0.0508 cm thickness and oxidized in pure oxygen at 500° C. for 325 h to form sub-oxide species.

A staged growth experiment was conducted on this material using a 725° C. anneal, a 0.1 hr anneal time and pressing as the means of deformation. Room temperature load force between anneals was 35,000 lbs and the number of press/anneal iterations was 6. The size of the tape was 0.025× 0.250 cm, and the tape contained 17,797 filaments. Although $J_c$ (zero field) did not improve, the strongly linked behavior of the oxide superconductor grains was significantly enhanced to give an improved retention of critical current density at 0.1 Tesla. The results for this experiment are reported in Table 2.

Figure 5:
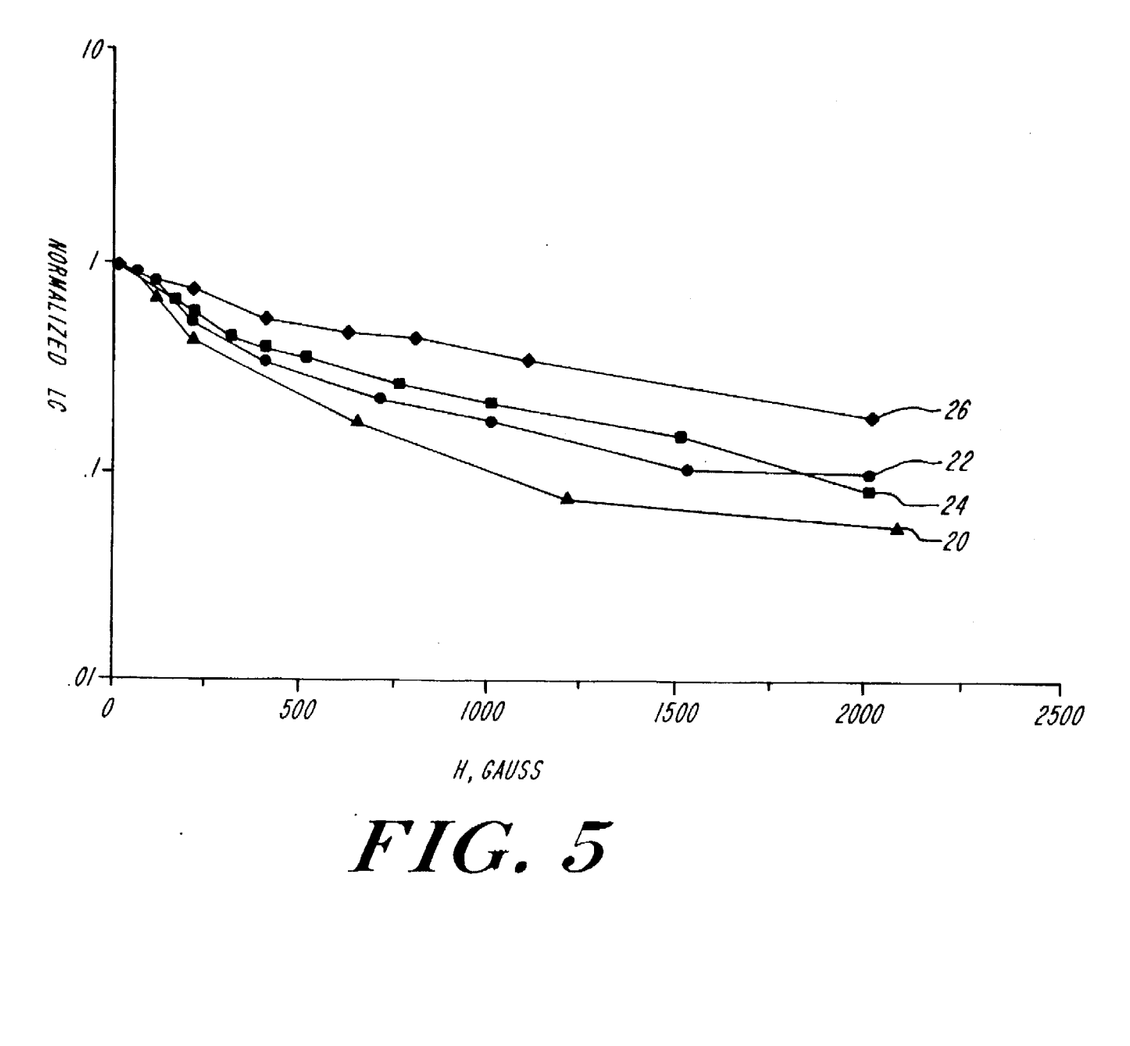
FIG. 5 is a plot of critical current v. magnetic field illustrating the improved critical current retention of materials processed according to the invention.

FIG. 5 illustrates the improvements obtained by the thermomechanical processing of the present invention. FIG. 5 is a plot of normalized $I_c$ v. magnetic field for the samples processed with varying anneal times and temperatures and deformation strains. It is apparent that the lower processing temperatures, shorter annealing times and higher force loads lead to higher retention of critical current in an applied magnetic field.

TABLE 2

| Staged Growth at 725° C./6 Iterations/35,000 lbs force | |
|---|---|
| $J_c$(4.2K, 0 Tesla) | 14,300 A/cm² |
| $J_c$(4.2K, 0.1 Tesla | 4,900 A/cm² |
| % retention at 0.1 Tesla | 34% |

TABLE 3

| Staged growth conditions for samples of Fig. No. 5 | | | |
|---|---|---|---|
| sample no. | anneal temperature (°C.) | anneal time (h) | number of iterations |
| 20 | 750 | control sample with no deformation step | |
| 22 | 800 | 1.0 | 2 |
| 24 | 750 | 0.1 | 3 |
| 26 | 750 | 0.1 | 6 |

What is claimed is:

1. A method for preparing a strongly-linked oxide superconductor article, comprising the steps of:
   (a) producing an article comprising a metallic precursor of an oxide superconductor in a desired shape;
   (b) oxidizing the article comprising the metallic precursor at a temperature such that a finely divided sub-oxide species is produced without converting more than 10 vol % of the sub-oxide species into the oxide superconductor;
   (c) annealing and deforming the article comprising the finely divided suboxide species, the annealing carded out at a temperature and for a time such that about 5 to 30 vol % of the total oxide species is converted into fine grains of the oxide superconductor and the deformation carried out such that the fine grains of oxide superconductor are rotated into alignment parallel to an intended current carrying direction of the article without substantial fracture or pulverization of the oxide superconductor grains and without said suboxide species being rotated into alignment parallel to the intended current carrying direction of the article;
   (d) alternating annealing and deformation of the article as in step (c) until no further rotation of the oxide superconductor grains is observed upon deformation; and
   (e) subjecting the article comprising the oxide superconductor grains to a final anneal, thereby converting any remaining sub-oxide species into oxide superconductor.

2. The method of claim 1 wherein the metallic precursor is finely divided.

3. The method of claim 1, wherein one metal comprising the metallic precursor is a solid continuous phase and remaining metals comprising the metallic precursor are finely divided.

4. The method of claim 1 wherein the desired shape is a wire including forming the wire by introducing the metallic precursor into a noble metal sheath and extruding said sheath and said precursor.

5. The method of claim 4 wherein the desired shape is a multifilamentary wire, including forming the multifilamentary wire by introducing the metallic precursor into a noble metal sheath and extruding to form a wire and grouping together a plurality of the extruded wires and further co-extruding the grouped wires.

6. The method of claim 1 wherein the desired shape is a tape, including forming the tape by introducing the metallic precursor into a sheath and rolling said sheath and said precursor.

7. The method of claim 6 including stacking a plurality of tapes and subjecting the stacked tapes to the deformation and annealing of step (c).

8. The method of claim 1 wherein the metallic precursor further includes a noble metal.

9. The method of claim 1, including obtaining the metallic precursor from mechanical alloying.

10. The method of claim 1 wherein the temperature of step (b) is in the range of 300°–500° C.

11. The method of claim 1 wherein the annealing temperature of step (c) is in the range of 550°–960° C.

12. The method of claim 1 wherein the deformation step includes an operation selected from the group consisting of pressing, rolling, drawing, extruding and swaging.

13. The method of claim 1 wherein the oxide superconductor is selected from the group consisting of 123-type, 124-type and 247-type oxide superconductors.

14. The method of claim 1 wherein the number of deformation steps is in the range of 2 to 10.

15. The method of claim 1 wherein the deformation step includes applying a strain in the range of 50% to 95% thickness reduction.

16. A method for preparing a strongly-linked 124-type oxide superconductor wire, comprising the steps of:

(a) introducing a metallic precursor of a 124-type oxide superconductor into a silver sheath;

(b) extruding the sheathed metallic precursor into a wire;

(c) oxidizing the wire at a temperature in the range of 300°–500° C. to form a finely divided oxide species;

(d) annealing and deforming the wire, in either order, the annealing carried out at a temperature in the range of 550°–800° C. and for a time such that about 5 to 30 vol % of the total oxide species is converted into fine grains of 124-type oxide superconductor and the deformation carded out such that the fine grains of oxide superconductor are rotated into alignment parallel to an intended current carrying direction of the wire without substantial fracture or pulverization of the oxide superconductor grains and without said suboxide species being rotated into alignment parallel to the intended current carrying direction of the wire;

(e) alternating annealing and deformation of the wire as in step (d) until no further rotation of the 124-type oxide superconductor grains is observed upon deformation; and (f) subjecting the wire comprising the 124-type oxide superconductor grains to a final anneal, thereby converting any remaining sub-oxide species into 124-type oxide superconductor.

* * * * *

UNITED STATES PATENT AND TRADEMARK OFFICE
CERTIFICATE OF CORRECTION

PATENT NO. : 5,683,969
DATED : November 4, 1997
INVENTOR(S) : Lawrence J. Masur and Eric R. Podtburg It is certified that error appears in the above-identified patent and that said Letters Patent is hereby corrected as shown below:

In column 5, line 49; after "and", please delete "Pro" and insert therefor --Pm--.

In column 8, line 44; after "consisted", please delete "Of" and insert therefor --of--.
Column 10:
In claim 1; line 11; after "annealing", please delete "carded" and insert therefor --carried--.
Column 12:
In claim 16; line 13; before "out", please delete "carded" and insert therefor --carried--.

Signed and Sealed this

Twenty-third Day of March, 1999

Attest:

Q. TODD DICKINSON

*Attesting Officer*  *Acting Commissioner of Patents and Trademarks*